Aug. 19, 1969 B. E. SEAR 3,462,699

POWER AMPLIFIER

Filed Nov. 8, 1965 2 Sheets-Sheet 1

INVENTOR
BRIAN E. SEAR
BY Arthur Freilich
ATTORNEY

INVENTOR.
BRIAN E. SEAR
BY Arthur Freilich
ATTORNEY 3,462,699

POWER AMPLIFIER

Brian E. Sear, Canoga Park, Calif., assignor to The Bunker-Ramo Corporation, Stamford, Conn., a corporation of Delaware Filed Nov. 8, 1965, Ser. No. 506,649
Int. Cl. H03f 3/10
U.S. Cl. 330—34 8 Claims

ABSTRACT OF THE DISCLOSURE

A power amplifier suitable for use up to microwave frequencies. The amplifier utilizes first and second oppositely poled unidirectional circuit branches connected in series with first and second serially connected and similarly poled storage diodes. A pump source is connected across the storage diodes to alternately apply forward and reverse biasing potentials thereto to alternately charge and discharge the storage diodes. An input signal is applied to the storage diodes to differentially charge the storage diodes based upon its polarity and amplitude. During each cycle, the storage diode storing less charge will be discharged first, thereby permitting the charge remaining in the other storage diode to be steered into an output load. Power gain is achieved if the magnitude of the reverse biasing exceeds the magnitude of the forward biasing.

This invention relates generally to electronic power amplifier circuits and more particularly to solid state amplifiers suitable for use up to microwave frequencies.

Many applications exist where broadband power amplification (e.g. from DC to 1 gigacycle) is required. Although different transistor and tunnel diode techniques have been employed in an attempt to fulfill this requirement, none have thus far provided satisfactory results. For the most part, prior art techniques have not been able to provide satisfactory power gains over the desired bandwidth at sufficiently high power levels for a reasonable cost. The present invention is directed primarily to innovations for overcoming these prior art deficiencies.

In accordance with a first aspect of the present invention, power amplification of a signal is achieved by injecting charge in a forward direction into a charge storage device, which device presents a low input impedance to the source, and then driving this same charge out in the reverse direction into a high impedance load. The power gain thus achieved is approximately equal to the ratio of output to input impedance.

In accordance with another aspect of the present invention, a multiple stage amplifier is provided by employing suitable impedance matching devices, such as tapered transmission line transformers, between stages to match the high output impedance of a preceding stage to the low input impedance of a succeeding stage.

In a preferred embodiment of the invention, first and second oppositely poled parallel circuit branches are connected in series with first and second serially connected and similarly poled storage diodes. A pump source is connected across the storage diodes to alternately drive current in a forward and reverse direction therethrough to alternately charge and discharge the storage diodes. In addition, means are provided coupling the storage diodes to an input signal source which differentially affects the charging of the storage diodes based upon the polarity and amplitude of the input signal. The storage diode storing less charge will be discharged by the pump source sooner than the storage diode storing more charge thereby permitting the charge remaining in the latter storage diode to be steered into the output load.

Circuit arrangements structurally similar to those employed herein have previously been employed for other purposes. For example, U.S. patent application Ser. No. 407,084, filed by Brian E. Sear on Oct. 28, 1964, and assigned to the same assignee as the present application, discloses such a circuit for use as a shift register stage.

The novel features that are considered characteristic of this invention are set forth with particularity in the appended claims. The invention will best be understood from the following description when read in connection with the accompanying drawings, in which:

Figure 1:
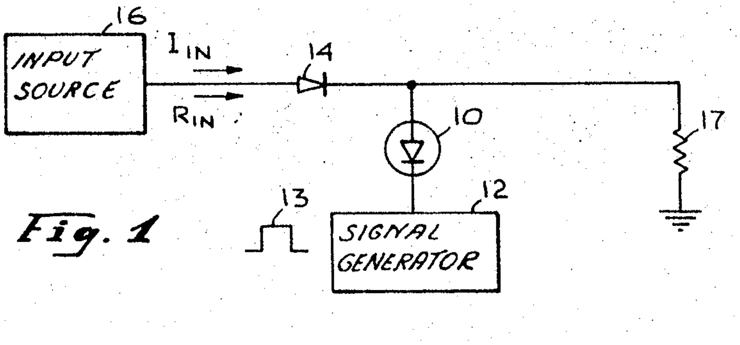
FIGURE 1 is a circuit diagram illustrating a basic embodiment of the present invention.

Attention is now called to FIG. 1 of the drawings which illustrates a basic embodiment of a power amplifier constructed in accordance with the present invention. More particularly, the amplifier of FIG. 1 includes a charge storage device 10, illustrated as a charge storage diode having anode and cathode terminals. The cathode terminal is connected to a source of positive-going pulses 12 while the anode thereof is connected to the cathode of a conventional diode 14. An input signal source 16 is connected to the anode of the diode 14. A load device 18 is connected between the anode of the storage diode 10 and a source of reference potential such as ground.

Prior to considering the operation of the circuit of FIG. 1, some brief comments will be made with respect to the operating characteristics of charge storage diodes.

The charge storage diode is characterized by its ability to conduct a current in a reverse direction therethrough when a reverse voltage is applied immediately after it has been conducting in a forward direction. More particularly, a charge storage diode, as a conventional diode, normally exhibits a very low forward impedance and a very high reverse impedance. The charge storage diode differs from conventional diodes, however, in that there is a recovery phase after forward conduction therethrough during which it presents a low backward impedance for a very short time thereby permitting a reverse current to flow whose amplitude is determined by the applied reverse voltage and the reverse loop impedance. The recovery phase lasts only long enough to permit the minority carriers within the diode to recombine. Prior to the minority carriers recombining, the diode can be considered as charged.

In order to understand the operation of the embodiment of FIG. 1, let it initially be assumed that a direct current input signal $I_{IN}$ is applied to the amplifier input terminal, i.e. the anode of diode 14, by input source 16. The input current will be conducted in a forward direction through both diode 14 and the charge storage diode 10 to thus store charge in the diode 10. When the source 12 subsequently applies a pulse 13 to the cathode of the diode 10, a current will be driven through the diode 10 in a reverse direction to drive the stored charge therefrom. Due to the presence of the diode 14, this reverse current through the storage diode 10 will necessarily be steered through the load impedance 17.

The power gain $G_p$ of the embodiment of FIG. 1 is by definition equal to a ratio between the power delivered to the load $P_L$ and the input power $P_{IN}$ (i.e.

$$G_p = \frac{P_L}{P_{IN}})$$

The input power $P_{IN}$ equals the product of $I_{IN}^2$ and $R_{IN}$ (i.e. $P_{IN}=I_{IN}^2.R_{IN}$). The load power $P_L$ is equal to the product of $I_L^2$ and $R_L$ (i.e. $P_L=I_L^2.R_L$). If the durations of the input current $I_{IN}$ and load current $I_L$ are substantially equal, then $I_{IN}$ will substantially equal $I_L$ inasmuch as all of the charge stored by the input current will be driven therefrom by the pulse 13. Accordingly, the power gain $G_p$ to a first order approximation can be expressed as $R_L/R_{IN}$. Inasmuch as the total input impedance is represented substantially by the forward impedance of the diodes 14 and 10, it is very low. As a consequence, very substantial power gains can be realized utilizing the embodiment of FIG. 1.

Figure 2:
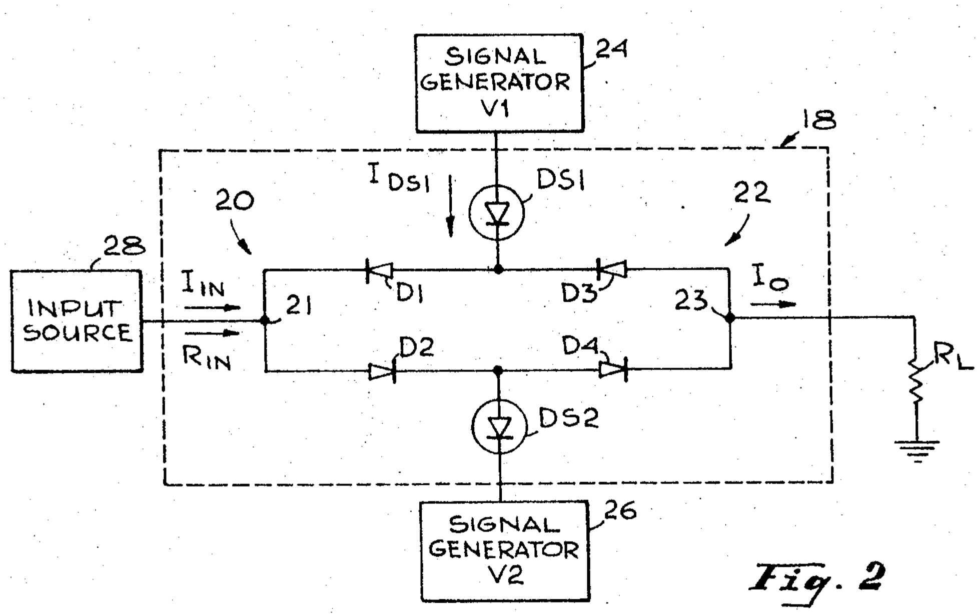
FIG. 2 is a circuit diagram illustrating a preferred embodiment of the present invention.

Attention is now called to FIG. 2 which illustrates an amplifier circuit 18 comprising a preferred embodiment of the present invention. It can be noted that the amplifier circuit 18 is similar in construction to a shift register stage illustrated in FIG. 3 of the aforecited patent application. The operation of the shift register stage is, however, significantly different from the amplifier 18. More particularly, as will be seen hereinafter, the amplifier circuit 18 provides power amplification of both alternating and direct current input signals whereas the shift register stage primarily provided storage for a direct current binary signal. The circuit 18 of FIG. 2 is also similar to the circuit of FIG. 1 except, however, in order to provide for the amplification of alternating current signals, the input signal is employed to differentially affect the charging of two storage diodes, which in the absence of the input signal would be charged equally, rather than to actually charge a storage diode as in FIG. 1.

More particularly, the circuit 18 includes first and second unidirectional current conducting circuit branches 20 and 22 connecting the cathode of diode DS1 to the anode of diode DS2. The first circuit branch 20 includes serially connected and similarly poled conventional diodes D1 and D2 which define a junction 21 therebetween. The second circuit branch 22 includes serially connected and similarly poled diodes D3 and D4 which define a circuit junction 23 therebetween.

The anode of storage diode DS1 is connected to the output of a signal generator 24 providing a signal V1 and the cathode of storage diode DS2 is connected to the output of signal generator 26 providing a signal V2. As will be seen hereinafter, signals V1 and V2 act as "pump" signals for alternately applying across the storage diodes, a forward biasing potential to drive a forward current therethrough to store charge therein and a reverse biasing potential to drive a reverse current therethrough to drive the stored charge therefrom. An input source 28 is connected to the circuit junction 21 to control the relative magnitude of the charge stored in diodes DS1 and DS2 by the pump source. In accordance with the invention, the input source 28 can provide an alternating or direct current signal which can comprise either a digital or analog signal. A bidirectional load impedance $R_L$ is connected to the circuit junction 23.

Figure 3:
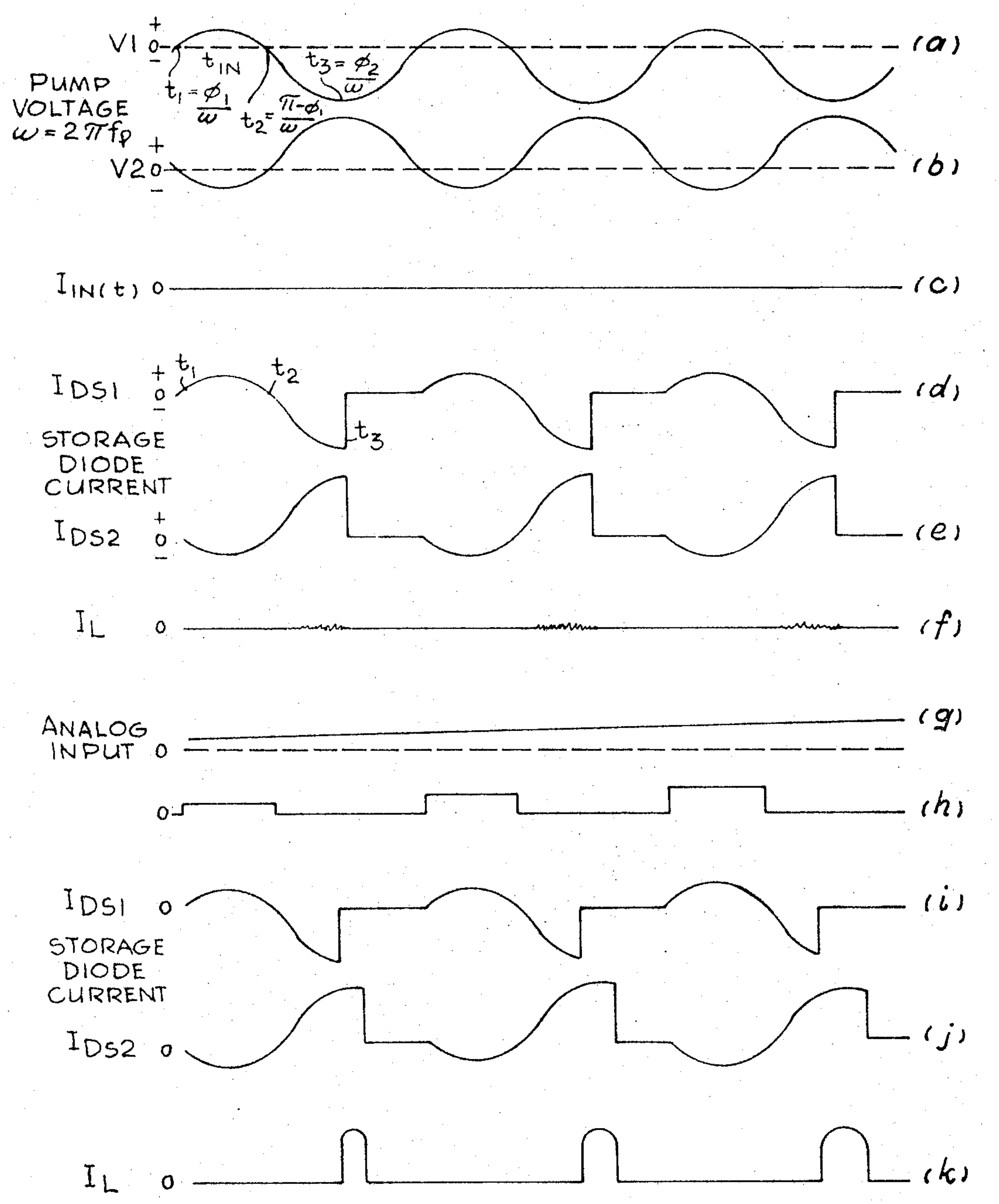
FIG. 3 is a waveform chart illustrating signals occurring at various points in the embodiment of FIG. 2.

In order to understand the operation of the embodiment of FIG. 2, attention is called to FIG. 3 which in lines *a* and *b* respectively illustrates waveforms V1 and V2 provided by the signal generators 24 and 26. Let it initially be assumed that input source 28 provides a zero level output signal as represented by line *c*. Let it also be assumed that the pump signals V1 and V2 respectively comprise sine waves of the same frequency, $F_P$, but of opposite phase. Thus, when the signal V1 is in a positive half cycle and the signal V2 is in a negative half cycle, a current will be conducted in a forward direction through the storage diodes DS1 and DS2 and in a forward direction through the diodes D1 and D2. The forward current through the storage diodes DS1 and DS2 will, of course, store charge therein which can be driven out by a reverse current therethrough. This reverse current is provided during a positive half cycle of the signal V2 and a negative half cycle of the signal V1. The reverse current path of course includes the diodes D4 and D3.

In order to fully drive the stored charge out of the storage diodes in less than the full positive half cycle interval of the signal V2, the signals V1 and V2 are both provided with a direct current offset so that the reverse voltage normally applied to the storage diodes has a magnitude greater than the forward voltage as represented in lines *a* and *b* of FIG. 3. Thus, note that charge will be stored in the diodes DS1 and DS2 during the interval between time $t_1$ (where $$t_1=\frac{\phi 1}{\omega})$$

and time $t_2$ (where $$t_2=\frac{\pi-\phi_1}{\omega})$$

Due to the greater magnitude of the reverse voltage, the charge will be driven out of the storage diodes by time $t_3$ (where $$t_3=\frac{\phi_2}{\omega})$$

which as indicated is prior to the termination of the positive half cycle of the voltage V2. Preferably, the time $t_3$ is chosen to occur approximately halfway through the positive half cycle of signal V2. With the input current equal to zero as shown in line *c*, the current through the storage diodes DS1 and DS2 is as shown in lines *d* and *e*. Note that charge is stored between times $t_1$ and $t_2$ and the stored charge is then removed between times $t_2$ and $t_3$. Inasmuch as equal amounts of charge are stored in the storage diodes DS1 and DS2 during the positive half cycle of signal V1, both storage diodes will be fully discharged at the same time (i.e. $t_2$) and thus no current $I_L$ [line *f*] will be steered into the load impedance $R_L$.

Assume now, however, that input source 28 does provide an analog input current [line *g*] which when integrated over the pump storage period (i.e. $1/F_P$) can be represented by an average constant current $I_{IN}$ for an average time $T_{IN}$ (where $T_{IN}=t_2-t_1$) [line *h*]. Where the analog input has a frequency $F_A$, the circuit acts similarly to a sampling system in which the analog input is sampled at the pump frequency $F_P$. Therefore, by the sampling theorem, the frequency $F_P$ must be chosen to be greater than the frequency $F_A$. The positive current $I_{IN}$, for the period $T_{IN}$, provided by input source 28 will cause a greater current in storage diode DS2 and a lesser current in storage diode DS1. Thus, a charge, which is greater by a differential amount, substantially equal to the product of $I_N$ and $T_{IN}$ will be stored in diode DS2, as compared to the charge stored in diode DS1. As a consequence of the charge imbalance between the storage diodes DS1 and DS2, the reverse current through the storage diodes will drive the charge out of the storage diode DS1 [line *i*] prior to it being completely driven out of the storage diode DS2 [line *j*]. Consequently, the charge $$Q_{IN}(Q_{IN}=I_{IN}\cdot T_{IN})$$

will be steered into the load impedance $R_L$. If the input current were negative then the charge imbalance would favor storage diode DS1. That is, a greater forward current would be drawn through diode DS1 than would be driven through diode DS2. Consequently, when the stored charge is driven out of the storage diodes, diode DS1 will draw current from the load or in other words negative pulses will be applied to the load. It should be appreciated that the envelope of the output pulses shown in line *k* will substantially duplicate the analog input signal at a higher power level.

Inasmuch as the resulting output current $I_L$ [line *k*] can be considered to be substantially equal to the input current $I_{IN}$ the power gain of the circuit of FIG. 2, similarly to that of FIG. 1, can be represented by the ratio of output to input impedances; i.e. $G_P=R_L/R_{IN}$. With presently available diodes, the input impedance $R_{IN}$ can be on the order of 5 ohms while an output impedance on the order of 150 ohms can be employed. Therefore, power gains on the order of 30:1 are realizable employing the circuit embodiment of FIG. 2.

Figure 4:
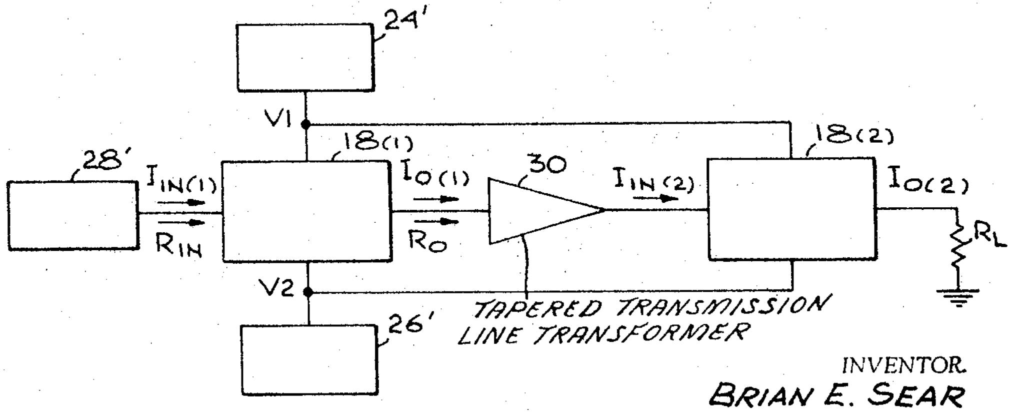
FIG. 4 is a block diagram illustrating a multiple stage amplifier constructed in accordance with the present invention.

Even greater power gains can be realized, however, when the circuit 18 of FIG. 2 is employed as a single stage in a multiple stage amplifier. For this purpose, it is essential to provide an impedance matching means between the high impedance output of one stage 18 (1) (FIG. 4) and the low impedance input of a succeeding stage 18 (2). It is a feature of the present invention to employ a tapered transmission line transformer 30 for this purpose. Such device are known in the art and are discussed on page 183 of the text entitled "Microwave Theory and Techniques" published by D. Van Nostrand Company Inc. by Reich, Ordung, Krauss, and Skalnik, 1953.

From the foregoing, it should be apparent that a comparatively simple and inexpensive power amplifier arrangement has been provided herein which is suitable for providing power gain over a broadband up to microwave frequencies. Although, the amplification of only analog signals has been specifically discussed, the disclosed embodiments are equally useful for amplifying digital signals. For digital amplification, however, consideration of the sampling theorem is not necessary. That is, by synchronizing the pump frequency $F_P$ and the bit rate $F_B$, $F_P$ can be chosen to be equal to $F_B$.

The embodiments of the invention in which an exclusive property or privilege is claimed are defined as follows:

1. An amplifier comprising:

a plurality of substantially identical stages including first and last stages, each of said stages including first and second charge storage devices connected in series;

first and second oppositely poled unidirectional circuit branches connected in parallel with each other and in series with said charge storage devices, each of said circuit branches including first and second unidirectional current conducting elements defining a junction therebetween;

current source means connected to said storage devices for alternately tending to drive forward and reverse currents therethrough;

an input signal source;

means coupling said input signal source to said junction defined in said first circuit branch of said first stage for causing said storage devices to store different amounts of charge depending upon said input signal;

impedance matching means connecting the junction defined in the second circuit branch of each of said stages other than said last stage to the junction defined in the first circuit branch of a succeeding stage; and a load device connected to said junction defined in said second circuit branch of said last stage.

2. The amplifier of claim 1 wherein said impedance matching means comprises a tapered transmission line transformer.

3. An amplifier comprising:

first and second charge storage diodes each having an anode and a cathode;

first and second parallel circuit branches connecting said first storage diode cathode to said second storage diode anode, each of said circuit branches including first and second unidirectional current conducting elements defining a junction therebetween;

first and second signal generators respectively connected to said first storage diode anode and said second storage diode cathode, said first and second signal generators providing first and second alternating voltages 180° out of phase with one another to alternately provide a forward biasing and a back biasing potential across said storage diodes, said first and second alternating voltages being offset in opposite directions from a common reference level so that said back biasing potential exceeds said forward biasing potential in magnitude;

an input signal source;

means coupling said input signal source to said junction defined in said first circuit branch for causing said storage diodes to conduct different magnitudes of current in a forward direction therethrough depending upon said input signal when said forward biasing potential is provided; and load means connected to said junction defined in said second circuit branch providing a current path for a reverse current through one of said storage diodes when said back biasing potential is provided.

4. The amplifier of claim 3 wherein said offset is selected so that the charge stored in said storage diodes as a consequence of said forward biasing potential is removed during substantially the initial half of the duration of said back biasing potential.

5. The arrangement of claim 3 wherein said input signal has a frequency $F_B$ and said alternating voltages have a frequency $F_P$ where $F_B = F_P$.

6. The arrangement of claim 3 wherein said input signal has a frequency $F_A$ and said alternating voltages have a frequency $F_P$ where $F_P/2 > F_A$.

7. The arrangement of claim 8 wherein said alternating voltages comprise sine waves.

8. The arrangement of claim 3 wherein said amplifier circuit has an input impedance $R_{IN}$ and an output impedance $R_L$ and where $R_L > R_{IN}$.

References Cited

UNITED STATES PATENTS

| | | | |
|---|---|---|---|
| 2,879,409 | 3/1959 | Holt | 330—34 |
| 2,908,830 | 10/1959 | Mason et al. | 330—34 |
| 2,997,659 | 8/1961 | Abbott et al. | 330—34 |
| 3,205,376 | 9/1965 | Berry et al. | 307—281 |
| 3,249,772 | 5/1966 | Burns et al. | 307—281 |
| 3,184,605 | 5/1965 | Herzog | 307—281 |

OTHER REFERENCES

Reprint of November 1963 issue of EEE "Understanding Snap Diodes" by J. Giorgis.

JOHN KOMINSKI, Primary Examiner

U.S. Cl. X.R.

307—281, 319